United States Patent
Yates et al.

(10) Patent No.: US 6,703,319 B1
(45) Date of Patent: Mar. 9, 2004

(54) COMPOSITIONS AND METHODS FOR REMOVING ETCH RESIDUE

(75) Inventors: Donald L. Yates, Boise, ID (US); Donald L. Westmoreland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/595,714

(22) Filed: Jun. 16, 2000

Related U.S. Application Data

(60) Provisional application No. 60/139,539, filed on Jun. 17, 1999.

(51) Int. Cl.[7] .................. H01L 21/302; C09K 13/00; C09K 13/06; C09K 13/08
(52) U.S. Cl. .................. 438/745; 252/79.1; 252/79.3; 252/79.4
(58) Field of Search .................. 438/745; 252/79.1, 252/79.4, 79.3

(56) References Cited

U.S. PATENT DOCUMENTS

| | | | |
|---|---|---|---|
| 3,968,565 A | * 7/1976 | Bertens et al. .................. 438/3 |
| 5,545,289 A | * 8/1996 | Chen et al. .................. 438/694 |
| 5,741,368 A | 4/1998 | Sahbari .................. 134/38 |
| 5,780,359 A | * 7/1998 | Brown et al. .................. 438/659 |
| 5,811,022 A | * 9/1998 | Savas et al. .................. 216/68 |
| 5,851,302 A | * 12/1998 | Solis .................. 134/1.2 |
| 5,876,903 A | * 3/1999 | Ng et al. .................. 430/313 |
| 5,891,803 A | * 4/1999 | Gardener .................. 438/660 |
| 6,063,712 A | 5/2000 | Gilton et al. .................. 438/756 |

FOREIGN PATENT DOCUMENTS

| | | | | |
|---|---|---|---|---|
| DK | 0662705 A2 | * 12/1994 | .......... H01L/21/321 |
| DK | 0773780 A1 | * 11/1996 | .............. G03F/7/42 |
| JP | 411067702 A | * 3/1999 | |
| WO | WO 99/45443 | 9/1999 | .............. G03F/7/42 |

OTHER PUBLICATIONS

Sotoaka et al. Cleaning solvent for manufacturing semiconductor element and semicondcutor element using the same. (English Abstract of JP 411067703 A), 1 page.*
Product information for: PRX–407® Advanced Plasma Etch Polymer Remover, Silicon Valley Chemlabs, Inc., Sunnyvale, CA 94086. (1998).
"Post–Etch SWP Removal," SVC Silicon Valley Chemlabs, Inc., Sunnyvale, CA 94086. (5 pgs.)–No date.
"Product Selection Guide," SVC Silicon Valley Chemlabs, Inc., Sunnyvale, CA 94086. (2 pgs.)–No date.
Material Safety Data Sheet for PRX–407®, Silicon Valley Chemlabs, Inc., Sunnyvale, CA 94086. (1998). (4 pgs).
"Material Safety Data Sheet", Shipley, *PRX–407 Advanced Plasma Etch Polymer Remover*, Jul. 26, 2000, 7 pgs.

* cited by examiner

*Primary Examiner*—Nadine G. Norton
*Assistant Examiner*—Lynette T. Umez-Eronini
(74) *Attorney, Agent, or Firm*—Mueting, Raasch & Gebhardt, P.A.

(57) ABSTRACT

A composition suitable for cleaning and methods of cleaning etch residue are provided. The composition includes at least one source of a fluoride ion and at least one organic solvent.

44 Claims, 2 Drawing Sheets

COMPOSITIONS AND METHODS FOR REMOVING ETCH RESIDUE

This application claims the benefit of U.S. Provisional Application No. 60/139,539, filed Jun. 17, 1999.

FIELD OF THE INVENTION

The present invention relates to compositions for removing etch residue and methods for their use, particularly in semiconductor device fabrication.

BACKGROUND

In the fabrication of semiconductor integrated circuits (ICs), various layers of inorganic material form semiconductor-based substrates. Some of the inorganic layers are patterned in desired shapes. The resulting inorganic layers form individual devices and interconnect structures within the IC.

Patterning conventionally includes masking an underlying layer with an organic resist material (i.e., mask), such as photoresist, exposing the resist, and removing exposed areas of the mask to form a patterned mask layer. The exposed inorganic layer underlying the patterned mask layer is then removed using an appropriate etchant. The patterned mask layer is then removed.

Etching is a process for removing unwanted material (i.e., partial or complete layers of material) from a surface (e.g., the surface of a semiconductor-based substrate). Organic or inorganic material, which may be patterned or unpatterned, of a substrate surface can be removed using an etching technique. Ideally, etching should precisely remove material that is not covered by a patterned mask layer (i.e., material that is "exposed" when a patterned mask layer is used).

The etchant is typically chemically varied according to the type of material being etched. Etchants are characterized as isotropic or anisotropic and further characterized as being selective or nonselective, depending on their ability to differentiate between material that they effectively etch. Selective etchants remove different types of material at different rates. Isotropic etchants remove material in all directions at the same rate.

Etching can occur in a wet or dry processing environment. Wet etching refers to the contact of a substrate surface with a liquid chemical etchant. Material is removed as an agitated liquid or spray, for example, passes over the substrate surface. Dry etching refers to the contact of a substrate surface with a gaseous plasma etchant. Wet etching is preferred over dry etching due to its ability to provide high, reliable throughput with excellent selectivity. Many wet etching compositions include water, however. When such aqueous compositions are used, they can cause problems with respect to corrosion, particularly corrosion of underlying metal layers. Corrosion inhibitors, such as catechol and pyrogallol, are typically used in aqueous etching compositions to reduce the corrosive nature of such etchants. Such compositions, however, can be toxic and require special handling precautions.

Commonly used wet etchants are hot alkaline etchants or acidic hydrogen peroxide ($H_2O_2$) etchants, which have a significant water content. Typically, alkaline solutions remove organic films, while acidic solutions remove alkali ions, alkali compounds, and other metallic contaminants. For wet etching silicon (Si), mixtures of nitric acid ($HNO_3$) and hydrofluoric acid (HF) are typically used. For wet etching silicon dioxide ($SiO_2$) or other oxides, various HF solutions are typically used, usually further containing a buffering agent to prevent depletion of fluoride ions from the etchant during etching. Silicon nitride ($Si_3N_4$) is typically wet-etched using a hot phosphoric acid ($H_3PO_4$) solution. Aluminum (Al) is typically wet-etched using a mixture of phosphoric acid ($H_3PO_4$), acetic acid ($CH_3COOH$), nitric acid ($HNO_3$), and water ($H_2O$).

Dilute HF and buffered oxide etchant (BOE), which is a dilute mixture of HF and ammonium fluoride ($NH_4F$), usually in a ratio of about 1 part HF to 6 parts $NH_4F$ (by volume), are prevalent conventional $SiO_2$ etchants. Both dilute HF and BOE are typically diluted in water in a ratio of about 10:1, 20:1, or 100:1 (i.e., 10, 20, or 100 parts (by volume) of water to one part reactive etchant components). Another conventional aqueous etchant, sold by Olin Hunt in Chandler, Ariz. that has been used to etch oxide is referred to as "SUPER Q," which is a mixture of $NH_4F$ and phosphoric acid ($H_3PO_4$).

Both wet and dry etching can leave an etch residue, although the residue is more dramatic for dry etching, which typically leaves a polymeric residue. This polymeric etch residue is a necessary component for achieving anisotropic etching. It typically includes halogenated organic compounds with inorganic material dispersed throughout and typically must be removed prior to subsequent processing. For example, etch residue may be a polymeric residue including tantalum, titanium, chlorine, and carbon therein when layers such as titanium nitride and tantalum pentoxide are patterned using photoresist and a chlorine-containing plasma etchant. If the etch residue is not effectively removed, various operating failures may occur. For example, conductive etch residue may cause a short between the first and second electrodes of a capacitor structure. Nonconductive etch residue may effect critical dimensions and adhesion of subsequent layers.

Various aqueous cleaning solutions are available for cleaning etch residue from semiconductor-based structures. For example, an SC1 clean, an SC2 clean, a piranha clean, a buffered oxide etch solution, and other fluorine-containing aqueous-based chemistries have been used for cleaning residues-from structures. However, such cleaning solutions are not effective at removing etch residue from a wide variety of semiconductor structures, such as vias. Such cleaning solutions typically fail to clean the etch residues without attacking the desired structures. These solutions also typically have the problem that they also attack and dissolve aluminum. Thus, these cannot be used to remove etch residue after aluminum patterning steps.

One commercially available cleaning composition does not typically attack aluminum; however, it does not remove etch residue at a very effective rate. This solution includes $NH_4F$ in a polyhydric alcohol. Thus, what is needed are cleaning compositions that effectively remove etch residue, such as polymeric dry etch residue, but do not typically attack desirable materials on semiconductor devices, such as aluminum, for example.

SUMMARY OF THE INVENTION

The present invention provides a composition useful for cleaning (i.e., removing etch residue from) etched substrates such as semiconductor device structures. The compositions of the present invention include one or more fluoride ion sources and one or more organic solvents. Significantly, because compositions of the present invention typically include one or more organic solvents and no greater than about 3 wt-% water, there is less attack on aluminum patterned features, even when compositions contain relatively high concentrations of fluoride ions.

Specifically, the present invention provides a method of removing etch residue from a substrate (preferably, a semiconductor structure), the method comprising: providing a composition comprising at least one fluoride ion source comprising an organic cation and at least one organic solvent; providing a substrate having etch residue on at least one surface; and contacting the surface of the substrate having etch residue thereon with the composition under conditions effective to remove at least a portion of the etch residue. The step of contacting the surface of the substrate may include immersing the substrate in the composition, spraying the surface of the substrate with the composition, or both.

In another embodiment, the present invention provides a cleaning method in a semiconductor fabrication process, the method comprising: providing a semiconductor structure having an etch residue on at least a portion thereof; providing a composition comprising at least one fluoride ion source comprising an organic cation and at least one organic solvent; and exposing the semiconductor structure to the composition to remove at least a portion of the etch residue. Preferably, the semiconductor structure comprises a via. Typically, the etch residue is present on the sidewalls of the via (0.6 micron diameter).

In another embodiment, the present invention provides a cleaning method in a semiconductor fabrication process, the method comprising: providing a semiconductor structure having an etch residue on at least a portion thereof; providing a composition comprising greater than about 1.0 wt-% of at least one fluoride ion source comprising an organic cation and at least one organic solvent; and exposing the semiconductor structure to the composition to remove at least a portion of the etch residue.

In yet another embodiment, the present invention provides a cleaning method in a semiconductor fabrication process, the method comprising: providing a semiconductor structure having an etch residue on at least a portion thereof; providing a composition consisting essentially of at least one fluoride ion source comprising an organic cation and at least one organic solvent; and exposing the semiconductor structure to the composition to remove at least a portion of the etch residue.

In still another method, the present invention provides a cleaning method in a semiconductor fabrication process, the method comprising: providing a semiconductor structure having an etch residue on at least a portion thereof and comprising a layer comprising at least a portion of exposed metal (preferably, aluminum); providing a composition comprising at least one fluoride ion source comprising an organic cation, and at least one organic solvent; and exposing the semiconductor structure to the composition to remove at least a portion of the etch residue and substantially none of the exposed metal, (preferably at 40° C. in an exposure time of no greater than about 5 minutes).

The present invention also provides a composition for use in integrated circuit fabrication, the composition consisting of greater than about 1.0 wt-% of at least one fluoride ion source comprising an organic cation and at least one organic solvent.

DETAILED DESCRIPTION OF PREFERRED EMBODIMENTS

Figure 1:
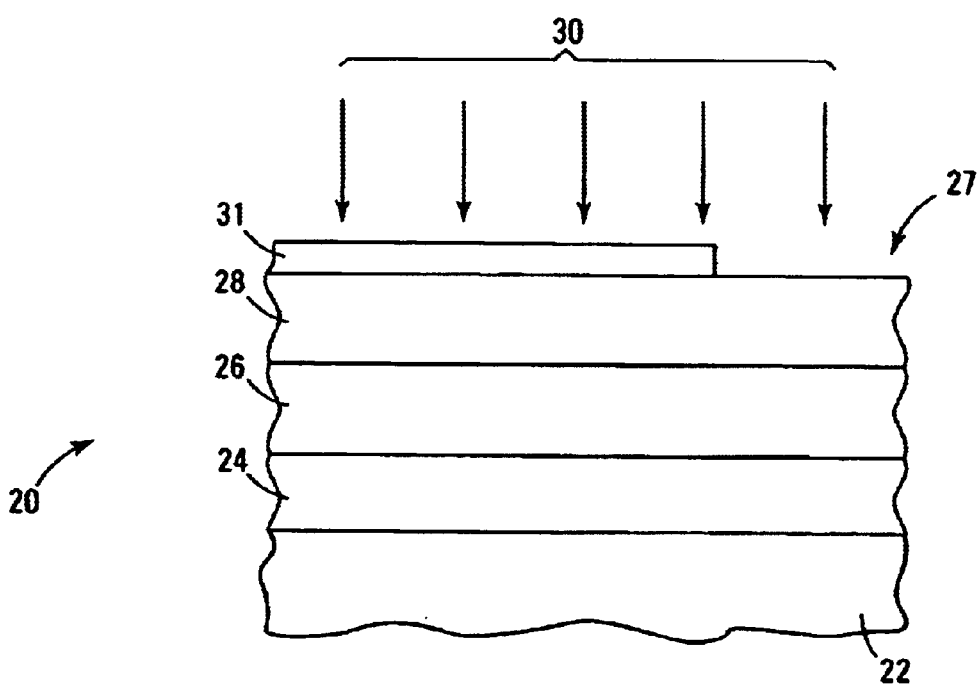
FIGS. 1–3 are illustrative diagrams of a cleaning process according to the present invention.

The present invention provides compositions that provide improved cleaning of etched substrates, particularly semiconductor device structures. Generally, the compositions include at least one source of fluoride ions and at least one organic solvent, which may be polar or nonpolar. The fluoride ion source(s) and organic solvent(s) are chosen such that there is sufficient solubility of the fluoride ions source(s) to allow for effective removal of at least a portion of the etch residue, particularly the polymeric residue that results from dry plasma etching processes. Thus, the fluoride ion source typically includes an organic cation and an ability to form free fluoride ions in solution.

Sources of fluoride ions include those containing an organic moiety, particularly an organic cation, and fluoride ions, particularly ($F^-$) or $HF_2^-$. Sources of fluoride ions that are suitable for this application can be associated with a variety of organic compounds, typically cations, such as cationic organic quaternary compounds containing Group 15 elements (the nitrogen group or Group VA elements), and stabilized carbocations and sulfonium cations. Examples include, but are not limited to, organoammonium cations (having alphatic, cyclic, alicycic, and/or aromatic groups), as are present in tetraethylammonium fluoride, tetramethylammonium fluoride, benzyltrimethylammonium hydrogen difluoride; pyridinium as is present in pyridinium poly (hydrogen fluoride); quaternary organophosphonium cations, as are present in tetraphenylphosphonium fluoride; quaternary organoarsonium cations, as are present in tetraphenylarsonium fluoride; quaternary organostibonium cations, as are present in tetraphenylstibonium fluoride; triorganocarbonium cations, as are present in triphenylcarbonium fluoride; and organosulfonium cations, as are present in sulfonium fluorides. Preferably, the fluoride ion source is a quaternatry ammonium fluoride.

Organic solvents that are suitable for this application can be one or more of the following: saturated or unsaturated linear, branched, or cyclic aliphatic (alicyclic) hydrocarbons (preferably $C_3–C_{20}$, and more preferably $C_5–C_{10}$), aromatic hydrocarbons (preferably $C_5–C_{20}$, and more preferably $C_5–C_{10}$), halogenated hydrocarbons, silylated hydrocarbons such as alkylsilanes, ethers, polyethers, thioethers, esters, lactones, amides, amines (aliphatic or aromatic, primary, secondary, or tertiary), polyamines, nitriles, cyanates, isocyanates, thiocyanates, silicone oils, aldehydes, ketones, diketones, carboxylic acids, carbonates, alcohols (mono and polyols), thiols, sulfones, sulfoxides, or compounds containing combinations of any of the above or mixtures of one or more of the above.

A preferred group of solvents includes esters such as ethyl acetate, ketones such as 2-pentanone, ethers such as dibutyl ether and tetrahydrofuran (THF), carbonates such as ethylene carbonate, alcohols such as methanol and ethanol, glycols, amides such as dimethyl formamide, and sulfoxides such as dimethyl sulfoxide. Particularly preferred solvents are glycols.

Water may be present in the compositions of the present invention, although it is not a necessary component, nor is it necessarily a desirable component. The water is typically present as a result of using a hydrated source of fluoride ion. Typically, no more than about 3 percent by weight (wt-%) water, based on the total weight of the composition, is present in a composition of the present invention.

The source of fluoride ion and organic solvent are chosen such that the fluoride ion source is generally soluble in the organic solvent at a temperature of about −10° C. to about 200° C. The fluoride ion source is present in an amount that provides effective removal of at least a portion of the etch residue, and preferably, substantially all the etch residue, with little or no attack on the desirable materials, such as aluminum, for example. Preferably, this is an amount of no greater than about 0.01 wt-%, more preferably, no greater than about 0.1 wt-%, even more preferably, no greater than about 0.5 wt-%, and most preferably, no greater than about 1.0 wt-%, based on the total weight of the composition. Any amount (e.g., up to about 50 wt-% and more) of the fluoride ion source can be used, which can be determined by one of skill in the art depending upon the desired result.

Preferably and advantageously, compositions of the present invention include one or more fluoride ion sources and one or more organic solvents without the need for other components to remove etch residue, particularly polymeric etch residue. However, compositions of the present invention can optionally include a variety of additives for desired effects. For example, they can include solubility enhancers such as chelating agents (e.g., crown ethers and polyamines), surfactants such as TRITON X, and corrosion inhibitors such as triethanolamine. Typically, such additives are added in amounts of no greater than about 3 wt-%, based on the total weight of the composition.

Compositions of the present invention are suitable for use in the cleaning of an etched substrate. Such substrates can include semiconductor substrates or substrate assemblies such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, word lines, bit lines, gate electrodes, vias, and and various other structures or features. Further, the various layers in a substrate assembly may be formed according to any particular suitable technique, such as sputtering, chemical vapor deposition, growth processes, such as growing silicon dioxide as an oxide layer, etc. Thus, the cleaning compositions of the present invention can be used on various configurations other than generally planar structures including, for example, a container capacitor structure, a stacked capacitor structure, etc. Further, the cleaning compositions of the present invention may be particularly beneficial in the fabrication of capacitor structures, for example, of a DRAM, an SRAM, or other memory devices.

Figure 2:
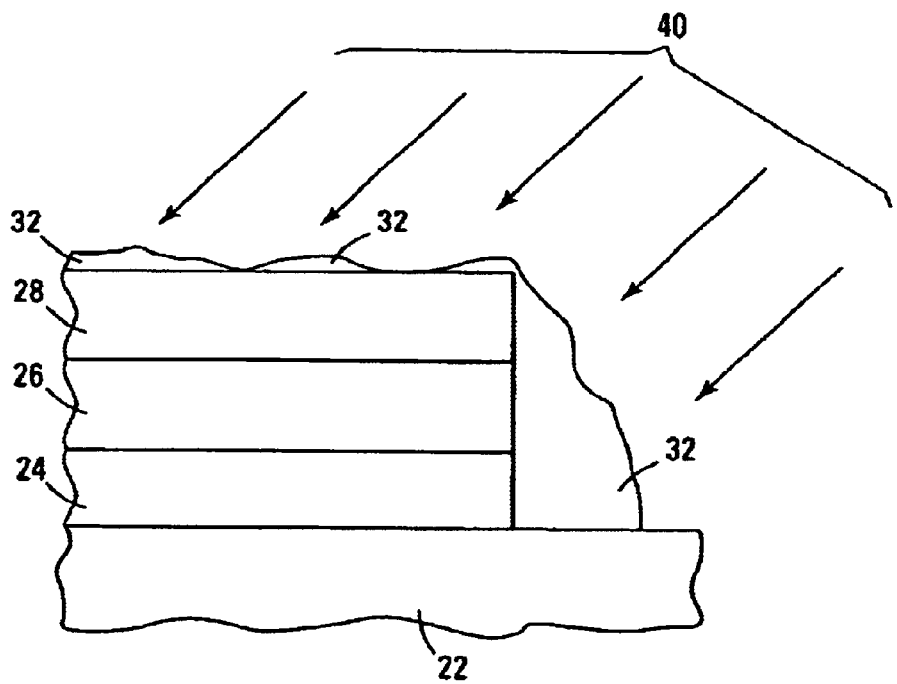

The cleaning processes of the present invention shall be generally described with reference to FIGS. 1–4. FIG. 1 generally illustrates a structure 20 for which a cleaning composition 40 (as shown in FIG. 2) according to the present invention is beneficial. The structure 20 includes a substrate assembly 22 and several layers formed thereon. For example, the layers formed on the substrate assembly 22 include at least one dielectric material layer 26 and either one or both of the layers 24 and 28 may be formed of conductive material depending upon the structure being formed. One skilled in the art will recognize that any of the layers 24, 26, and 28 may be formed of one or more materials or one or more layers. One skilled in the art will also recognize that the layers formed upon one another may take one of various different configurations. For example, the bottom electrode layer 24 for a capacitor structure may be formed in an opening, e.g., a trench, a container, etc., with the other layers formed thereover.

The stack of layers is generally patterned using conventional photolithography techniques such as with the use of a resist material 31, as shown in FIG. 1. An etchant 30, as shown in FIG. 1, such as a dry etchant, may be used in a suitable etching technique. This will typically leave an etch residue 32, as shown in FIG. 2, particularly a polymeric etch residue. The etch residue 32 will depend on the constituent elements of the stack of layers. Generally, the etch residue 32 is polymeric in nature and includes elements such as components of the metals etched during the dry etch process, components of the etchant gases, and components of the photoresist removed. For example, it can include halogenated organic compounds with inorganic material dispersed throughout. If this etch residue is not effectively removed, various operating failures may occur, such as shorts between the first and second electrodes of a capacitor structure, or adhesive failure between layers.

Cleaning compositions of the present invention can remove the etch residue 32 typically without fatally attacking the patterned stack, particularly an interlayer dielectric device. The removal of such etch residue is generally difficult in vias, particularly when the vias are formed in processing steps that involve patterning down to an aluminum layer. Preferred compositions of the present invention are particularly well suited for removing etch residues after such processing steps.

Generally, to clean the etch residue 32 from the patterned stack of layers, the cleaning method includes immersing the structure including the stack in a tank of the cleaning composition 40 as represented generally by the arrows in FIG. 2. Although immersion in the cleaning composition 40 is preferred, the cleaning composition 40 may also be sprayed onto the structure being cleaned or may be introduced for contact with the structure in any other manner.

The temperature of the cleaning composition is preferably maintained during the cleaning process at a constant temperature. Preferably, the composition temperature is within a range of about 20° C. to about 75° C. Typically, the temperature of the cleaning composition is about room temperature (i.e., about 20° C. to about 50° C.). The step of contacting the surface of the substrate may include immersing the substrate in the composition, spraying the surface of the substrate with the composition, or both.

Generally, removal of the etch residue 32 can be a time consuming process, which allows for metal layer attack and pitting. Typically, conventional cleaning processes can take significantly more than 5 minutes to remove the etch residue 32. For this reason, cleaning composition 40 is selected to remove etch residue in shorter periods of time, or are selected such that removal of material from the stack of layers 24, 26, 28 by the cleaning composition 40 is substantially reduced to an acceptable level.

After immersion in a tank or container of the cleaning composition 40, the structure being cleaned is removed and subjected to a drying technique. For example, an isopropyl alcohol vapor dry may be used to dry the structure upon removal from the cleaning composition 40.

One skilled in the art will recognize that in addition to immersion in the tank of cleaning composition 40, other techniques may be used to enhance the cleaning of the structure. For example, megasonic energy, ultrasonic energy, or other agitation techniques may be used in conjunction with the cleaning composition in accordance with the present invention.

Figure 3:
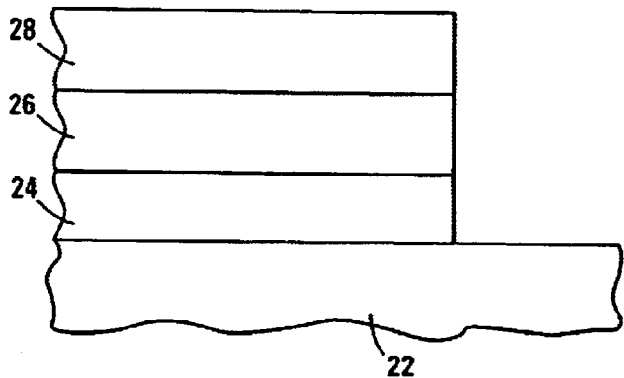

Upon removal from immersion in a tank of cleaning composition 40, the cleaned resultant structure is shown in FIG. 3. As shown therein, the etch residue 32 is completely removed.

Figure 4:
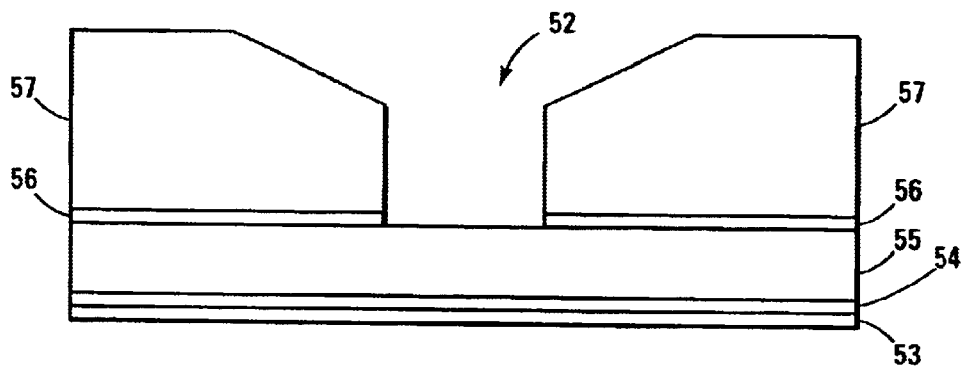
FIG. 4 is an illustrative diagram of a structure cleaned according to the present invention.

FIG. 4 illustrates an embodiment of a structure which may be cleaned using the cleaning composition 40 according to the present invention. One skilled in the art will recognize that other structures may be cleaned advantageously according to the present invention. FIG. 4 illustrates a structure 50 showing a via interconnect 52 cleaned according to the present invention.

As shown in FIG. 4, structure 50 includes a first layer 53, which is an adhesive layer that includes titanium metal, a second layer 54, which is an antireflective layer that includes titanium nitride, a third layer 55, which is a digit line or any conductive layer that includes an aluminum/copper alloy, a fourth layer 56, which is an antireflective layer that includes titanium nitride, and a fifth layer 57, which is a dielectric layer that includes silicon oxides. A cleaning composition of the present invention is advantageously used to clean the structure 50 to remove etch residue without significantly damaging the underlying layers of material, particularly the aluminum/copper alloy layer 55.

The following examples are given to illustrate specific preferred embodiments of the present invention. Numerous other variations, however, are within the scope of the present invention.

EXAMPLE

A structure similar to that shown in FIG. 4 having a 0.62 micron via interconnect with an approximately 5000 Angstrom interlayer dielectric (ILD) over an approximately 3800 Angstrom TiN/AlCu metal layer was cleaned using various cleaning compositions according to the present invention. The via was produced by initially removing approximately 2200 Angstroms of the ILD with a 20:1 buffered oxide etch followed by a $CF_4/CHF_3$ plasma etch to complete formation of the via. The resist was then removed with a post-etch ash in pure oxygen. Following the post-etch ashing procedure, the via was evaluated visually under scanning electron microscopy. There was significant etch residue.

A structure containing a via as described above was treated upon immersion in a control cleaning solution (an aqueous strong acid that does not contain a fluoride ion source) at 35° C. for 90 seconds. Most of the heavy residue was removed with some residue still remaining on the sidewalls.

A structure containing a via as described above was treated upon immersion in a cleaning composition commercially available under the trade designation PRX-407 from Silicon Valley Chemlabs, Inc., Sunnyvale, Calif. at 40° C. for up to 10 minutes. None of the residue was removed. Furthermore, as the treatment time increased the attack on the underlying AlCu dielectric layer became more pronounced.

Structures containing vias (0.6 micron diameter) as described above were also treated upon immersion with the following cleaning compositions under the following conditions. The results are also listed.

| Cleaning Composition | $F^-$ Concen | Time of Treatment | Residue Removal | Effect on Underlying Layers |
|---|---|---|---|---|
| TMAFT* (5 grams) dissolved in propylene glycol at 40° C. | 0.06 mol/l | 5 minutes | Significant residue remained on sidewalls | No metal dissolution |
| TMAFT* dissolved in propylene glycol at 40° C. | 0.18 mol/l | 5 minutes | No residue remained | None |
| TMAFT* dissolved in propylene glycol at 40° C. | 0.24 mol/l | 5 minutes | No residue remained | No metal dissolution |
| TMAFT* dissolved in propylene glycol at 40° C. | 0.36 mol/l | 5 minutes | No residue remained | No metal dissolution |
| TMAFT* dissolved in propylene glycol at 40° C. | 0.6 mol/l | 5 minutes | No residue remained | Slight metal dissolution |

*TMAFT = tetramethylammonium fluoride tetrahydrate containing approximately 39 wt-% coordinated water.

Cleaning compositions having lower concentrations of $F^-$ than 0.18 mole per liter (mol/l) were effective if treatment times were increased. Cleaning compositions having higher concentrations of $F^-$ than 0.6 mol/l demonstrated a more pronounced attack on the underlying Al/Cu dielectric layer when exposed for 5 minutes, but this could be ameliorated by shortening the process time. None of the compositions attacked the dielectric layer substantially.

Cleaning compositions containing tetraethylammonium fluoride hydrate, tetrabutylammonium fluoride hydrate, triethylamine trihydrofluoride, or pyridiniun poly(hydrogen fluoride) at analogous concentrations produced similar results.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

We claim:

1. A method of removing etch residue from a substrate, the method comprising:
   providing a composition comprising:
      at least one fluoride ion source comprising an organic cation; and
      at least one organic solvent, wherein the composition includes no more than about 3 wt-% water;
   providing a substrate having etch residue on at least one surface; and
   contacting the surface of the substrate having etch residue thereon with the composition under conditions effective to remove at least a portion of the etch residue.

2. The method of claim 1, wherein the step of contacting the surface of the substrate comprises immersing the substrate in the composition, spraying the surface of the substrate with the composition, or both the immersing and spraying steps.

3. The method of claim 1, wherein the substrate comprises a semiconductor substrate.

4. The method of claim 1, wherein the fluoride ion source includes $F^-$ ions or $HF_2^-$ ions.

5. The method of claim 1, wherein the fluoride ion source is present in the composition in an amount of no greater than about 0.01 wt-%.

6. The method of claim 1, wherein the fluoride ion source is present in the composition in an amount of no greater than about 0.1 wt-%.

7. The method of claim 1, wherein the fluoride ion source is present in the composition in an amount of no greater than about 0.5 wt-%.

8. The method of claim 1, wherein the fluoride ion source is present in the composition in an amount of no greater than about 1.0 wt-%.

9. The method of claim 1, wherein the fluoride ion source includes a cation selected from the group consisting of an organoammonium cation, a pyridinium cation, a quaternary organophosphonium cation, a quaternary organoarsonium cation, a quaternary organostibonium cation, a triorganocarbonium cation, and an organosulfonium cation.

10. The method of claim 9, wherein the fluoride ion source includes a quaternary ammonium fluoride.

11. A cleaning method in a semiconductor fabrication process, the method comprising:
    providing a semiconductor structure having an etch residue on at least a portion thereof;
    providing a composition comprising:
        at least one fluoride ion source comprising an organic cation; and
        at least one organic solvent, wherein the composition includes no more than about 3 wt-% water; and
    exposing the semiconductor structure to the composition to remove at least a portion of the etch residue.

12. The method of claim 11, wherein the exposing step includes exposing the semiconductor structure to the composition at a temperature of about 20° C. to about 75° C.

13. The method of claim 11, wherein the fluoride ion source includes $F^-$ ions or $HF_2^-$ ions.

14. The method of claim 11, wherein the fluoride ion source is present in the composition in an amount of no greater than about 1.0 wt-%.

15. The method of claim 11, wherein the fluoride ion source includes a cation selected from the group consisting of an organoammonium cation, a pyridinium cation, a quaternary organophosphonium cation, a quaternary organoarsonium cation, a quaternary organostibonium cation, a triorganocarbonium cation, and an organosulfonium cation.

16. The method of claim 11, wherein the etch residue comprises polymeric etch residue.

17. The method of claim 11, wherein the semiconductor structure comprises a via.

18. The method of claim 17, wherein the etch residue is present on the sidewalls of the via.

19. A cleaning method in a semiconductor fabrication process, the method comprising:
    providing a semiconductor structure having an etch residue on at least a portion thereof;
    providing a composition consisting essentially of:
        greater than about 1.0 wt-% of at least one fluoride ion source comprising an organic cation; and
        at least one organic solvent; and
    exposing the semiconductor structure to the composition to remove at least a portion of the etch residue.

20. A cleaning method in a semiconductor fabrication process, the method comprising:
    providing a semiconductor structure having an etch residue on at least a portion thereof;
    providing a composition consisting essentially of:
        at least one fluoride ion source comprising an organic cation; and
        at least one organic solvent; and
    exposing the semiconductor structure to the composition to remove at least a portion of the etch residue.

21. The method of claim 20, wherein the etch residue comprises polymeric etch residue.

22. The method of claim 20, wherein the semiconductor structure comprises a via.

23. The method of claim 22, wherein the etch residue is present on the sidewalls of the via.

24. The method of claim 20, wherein the exposing step includes exposing the semiconductor structure to the composition at a temperature of about 20° C. to about 75° C.

25. The method of claim 20, wherein the fluoride ion source includes $F^-$ ions or $HF_2^-$ ions.

26. The method of claim 20, wherein the fluoride ion source includes a cation selected from the group consisting of an organoammonium cation, a pyridinium cation, a quaternary organophosphonium cation, a quaternary organoarsonium cation, a quaternary organostibonium cation, a triorganocarbonium cation, and an organosulfonium cation.

27. The method of claim 20, wherein the fluoride ion source is present in the composition in an amount of no greater than about 1.0 wt-%.

28. A cleaning method in a semiconductor fabrication process, the method comprising:
    providing a semiconductor structure having an etch residue on at least a portion thereof and comprising a layer comprising at least a portion of exposed metal;
    providing a composition consisting essentially of:
        at least one fluoride ion source comprising an organic cation; and
        at least one organic solvent; and
    exposing the semiconductor structure to the composition to remove at least a portion of the etch residue and substantially none of the exposed metal.

29. The method of claim 28, wherein exposing the semiconductor structure is carried out at 40° C. in an exposure time of no greater than about 5 minutes.

30. A cleaning method in a semiconductor fabrication process, the method comprising:
    providing a semiconductor structure having an etch residue on at least a portion thereof and comprising a layer comprising at least a portion of exposed metal, wherein the metal is aluminum;
    providing a composition consisting essentially of:
        at least one fluoride ion source comprising an organic cation; and
        at least one organic solvent; and
    exposing the semiconductor structure to the composition to remove at least a portion of the etch residue and substantially none of the exposed metal.

31. A cleaning method in a semiconductor fabrication process, the method comprising:
    providing a semiconductor structure having an etch residue on at least a portion thereof;
    providing a composition consisting of:
        at least one fluoride ion source comprising an organic cation; and
        at least one organic solvent; and
    exposing the semiconductor structure to the composition to remove at least a portion of the etch residue.

32. A method of removing etch residue from a substrate, the method comprising:
    providing a composition comprising:
        at least one fluoride ion source comprising an organic cation; and
        at least one organic solvent, wherein the composition is free of water;
    providing a substrate having etch residue on at least one surface; and
    contacting the surface of the substrate having etch residue thereon with the composition under conditions effective to remove at least a portion of the etch residue.

33. The method of claim 32, wherein the step of contacting the surface of the substrate comprises immersing the substrate in the composition, spraying the surface of the substrate with the composition, or both the immersing and spraying steps.

34. The method of claim 32, wherein the substrate comprises a semiconductor substrate.

35. The method of claim 32, wherein the fluoride ion source includes $F^-$ ions or $HF_2^-$ ions.

36. The method of claim 32, wherein the fluoride ion source includes a cation selected from the group consisting of an organoammonium cation, a pyridinium cation, a quaternary organophosphonium cation, a quaternary organoarsonium cation, a quaternary organostibonium cation, a triorganocarbonium cation, and an organosulfonium cation.

37. The method of claim 32, wherein the fluoride ion source includes a quaternary ammonium fluoride.

38. The method of claim 32, wherein the fluoride ion source is present in the composition in an amount of no greater than about 1.0 wt-%.

39. The method of claim 38, wherein the fluoride ion source is present in the composition in an amount of no greater than about 0.5 wt-%.

40. The method of claim 39, wherein the fluoride ion source is present in the composition in an amount of no greater than about 0.1 wt-%.

41. The method of claim 40, wherein the fluoride ion source is present in the composition in an amount of no greater than about 0.01 wt-%.

42. A method of removing etch residue from a substrate, the method comprising:
providing a composition consisting essentially of:
at least one fluoride ion source comprising an organic cation; and
at least one organic solvent;
providing a substrate having etch residue on at least one surface; and
contacting the surface of the substrate having etch residue thereon with the composition under conditions effective to remove at least a portion of the etch residue.

43. A method of removing etch residue from a substrate, the method comprising:
providing a composition consisting of:
at least one fluoride ion source comprising an organic cation; and
at least one organic solvent;
providing a substrate having etch residue on at least one surface; and
contacting the surface of the substrate having etch residue thereon with the composition under conditions effective to remove at least a portion of the etch residue.

44. A cleaning method in a semiconductor fabrication process, the method comprising:
providing a semiconductor structure having an etch residue on at least a portion thereof;
providing a composition comprising:
at least one fluoride ion source comprising an organic cation; and
at least one organic solvent, wherein the composition is free of water; and exposing the semiconductor structure to the composition to remove at least a portion of the etch residue.

* * * * *

UNITED STATES PATENT AND TRADEMARK OFFICE
CERTIFICATE OF CORRECTION

PATENT NO. : 6,703,319 B1
DATED : March 9, 2004
INVENTOR(S) : Yates et al.

It is certified that error appears in the above-identified patent and that said Letters Patent is hereby corrected as shown below:

Title page,
Item [56], References Cited, FOREIGN PATENT DOCUMENTS, please delete "0773780 A1" and insert -- 773480 A1 --; and please delete "411067703 A" and insert -- 411067703 A --.

Signed and Sealed this

Seventeenth Day of August, 2004

JON W. DUDAS
*Acting Director of the United States Patent and Trademark Office*